United States Patent
Li

(10) Patent No.: US 8,102,471 B2
(45) Date of Patent: Jan. 24, 2012

(54) H-SYNC PHASE LOCKED LOOP DEVICE AND METHOD FOR A TV VIDEO SIGNAL

(75) Inventor: Hsin-I Li, Yilan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 1336 days.

(21) Appl. No.: 11/692,205

(22) Filed: Mar. 28, 2007

(65) Prior Publication Data

US 2008/0136967 A1 Jun. 12, 2008

(30) Foreign Application Priority Data

Dec. 6, 2006 (TW) .............................. 95145356 A

(51) Int. Cl.
*H03L 7/00* (2006.01)
(52) U.S. Cl. ...... 348/540; 348/500; 348/525; 348/E5.01
(58) Field of Classification Search .................. 348/540, 348/E5.01
See application file for complete search history.

(56) References Cited

U.S. PATENT DOCUMENTS

| | | | | |
|---|---|---|---|---|
| 5,555,025 A | * | 9/1996 | McArthur | 348/478 |
| 5,754,250 A | * | 5/1998 | Cooper | 348/525 |
| 5,805,233 A | * | 9/1998 | West | 348/537 |
| 6,369,857 B1 | * | 4/2002 | Balaban et al. | 348/555 |
| 7,345,714 B2 | * | 3/2008 | Chen | 348/692 |
| 7,701,512 B1 | * | 4/2010 | Woodall et al. | 348/526 |
| 2002/0085120 A1 | * | 7/2002 | Yamaguchi et al. | 348/558 |

* cited by examiner

*Primary Examiner* — Jefferey Harold
*Assistant Examiner* — Omer Khalid
(74) *Attorney, Agent, or Firm* — Jianq Chyun IP Office

(57) ABSTRACT

A H-sync phase locked loop device for TV video signal is provided herein. After the TV video signal is digitalized, clamping and slicing operations are performed on the digitalized TV video signal to respectively generate a clamped signal and a sliced signal. According to the clamped signal and the sliced signal, an H-sync frequency calculator can calculate the falling and rising transients of the H-sync signal and an H-sync frequency is obtained therefrom. Because the H-sync frequency is dynamically adjusted according to the input TV video signal, the phase locking of the input TV video signal can tolerate more deviations of the H-sync by replacing a predetermined H-sync frequency.

5 Claims, 4 Drawing Sheets

H-SYNC PHASE LOCKED LOOP DEVICE AND METHOD FOR A TV VIDEO SIGNAL

CROSS-REFERENCE TO RELATED APPLICATION

This application claims the priority benefit of Taiwan application serial no. 95145356, filed Dec. 6, 2006. All disclosure of the Taiwan application is incorporated herein by reference.

BACKGROUND OF THE INVENTION

1. Field of the Invention

The present invention generally relates to a phase locked loop (PLL) device, and more particular, to an H-sync phase locked loop device for a TV video signal.

2. Description of Related Art

A TV video signal includes a video frame signal and timing information so as to correctly retrieve the original video signal in a receiving TV set or display. The timing information mainly is a synchronization signal mixed in the video signal, so that after a receiving terminal obtains the video signal and the synchronization signal is correctly decoded, the corresponding video frames are generated. The synchronization signal is usually termed as 'sync'. Hence, how to correctly obtain the sync from a video signal is very fundamental to process a video signal, and a phase-locked loop circuit (PLL) is usually adopted to quickly, continuously and stably obtain the phase of the sync.

The basic overall function of a PLL is to use an oscillation source with an extremely-low frequency variation as the oscillation reference, adopt a closed-loop control system for feedback and drive a frequency-variable component, so that a target signal is synchronized with the oscillation source, i.e. the target signal is phase locked.

Referring to FIG. 1, it is an architecture diagram of a conventional H-sync phase locked loop circuit for a TV video signal. The H-sync phase-locked loop circuit (H-sync PLL) 100 of FIG. 1 is in charge of correctly and effectively obtaining an H-sync. The H-sync PLL includes a phase-locked loop latch (PLL latch) 102, an analog-to-digital converter (ADC) 110 (marked by A/D in FIG. 1), an auto-gain-control and clamping circuit (AGC and clamping circuit) 120, a slice level calculator 130, a phase-error detector 140, a digital gain and low-pass filter 150, a discrete time oscillator 160, an increment step number calculator 170 and a H-sync detection counter 180.

The PLL latch 102 is used for outputting a system timing signal 104 having a frequency $F_S$ to support the operation of the whole system including providing the ADC 110 with a sampling frequency. When the ADC 110 receives a TV video signal 105 containing an H-sync, the signal 105 is converted into a digital TV video signal 112. After that, the digital TV video signal 112 is sent to the AGC and clamping circuit 120 to perform an AGC and clamping processing to produce a clamped signal 122 with a controlled amplitude, and then the signal 122 is output to the slice level calculator 130 and the phase-error detector 140.

Once the slice level calculator 130 receives the clamped signal 122, a middle level of the H-sync is estimated and the estimated middle level 132 is output to the phase-error detector 140. On the other hand, the phase-error detector 140 receives the clamped signal 122, the estimated middle level 132 of the H-sync from the slice level calculator 130 and an H-sync phase signal (H-phase signal) 12 from the H-sync detection counter 180. The phase-error detector 140 generates a signal falling and rising transient according to the comparison result between the clamped signal 122 and the middle level 132 estimated by the slice level calculator 130, calculates the dynamic error of the H-phase signal 182 therewith and further generates a phase-error signal 142 output to the digital gain and low-pass filter 150.

The H-phase signal 182 is output from the H-sync detection counter 180, while the H-sync detection counter 180 receives a timing signal 162 with a frequency $F_{dto}$ output from the discrete time oscillator 160 and a preset required total pixel quantity output from each line (H-sync total) $H_T$. In fact, the H-sync total $H_T$ is the reciprocal of the frequency for each line to output pixels $F_O$, which would be explained hereinafter. Every period course of the timing signal 162 with the frequency $F_{dto}$, the number indicated by the counter 180, i.e. the H-phase signal output therefrom, would be increased by one until the H-phase signal reaches $\frac{1}{2}H_T$ where the H-phase signal is reset as $-\frac{1}{2}H_T$.

After the phase-error signal 142 is processed by the digital gain and low-pass filter 150, a dynamic increment step number 152 is output to the discrete time oscillator 160. The increment step number calculator 170 receives a signal with a predetermined H-sync frequency $F_H$ and a predetermined frequency for each line to output pixels $F_O$ and outputs a regular increment step number 174 to the discrete time oscillator 160, and then the discrete time oscillator 160 adjusts the frequency $F_{dto}$ of the timing signal 162 according to the regular increment step number 174 and the dynamic increment step number 152.

The H-sync frequency $F_H$ and the frequency for each line to output pixels $F_O$ are predetermined according to the format of the received TV video signal 105. For example, the NTSC format TV signal follows the communication standard of the National Television Standards Committee (NTSC), while the PAL formal TV signal and SECAM format TV signal respectively follow the standard of the Phase Alternating Line and the standard of the Sequential Color and Memory. Hence, the frequencies of the above-mentioned TV signals and the H-syncs thereof are certain.

However in fact, the H-sync of a TV video signal significantly deviates from the format standard caused by the transmission or other problems; thus, if a receiver still adopts the predetermined H-sync frequency $F_H$, the PLL thereof would fail to effectively lock the H-sync phase of the TV video signal and a very poor TV image effect would be resulted.

In addition, if a TV system enterprise provides a TV video signal other than the above-mentioned, for example, other than the NTSC signal, the PAL signal or the SECAM signal, the H-sync deviation problem of the TV video signal would get more serious where it is unable to predetermine an appropriate H-sync frequency $F_H$ at all.

SUMMARY OF THE INVENTION

Accordingly, the present invention provides an H-sync phase locked loop device for a TV video signal, which is capable of enhancing the tolerance of more deviation of an H-sync.

The present invention provides an H-sync phase locked loop device for a TV video signal, wherein an estimated from the active TV video signal and dynamically adjustable H-sync frequency, not a predetermined H-sync frequency, is adopted, so as to enhance the tolerance of more deviation of an H-sync.

The H-sync phase locked loop device (H-sync PLL device) of the present invention includes an analog-to-digital converter (ADC), an auto-gain-control and clamping circuit (AGC and clamping circuit), a slice level calculator, a H-sync frequency calculator, an increment step number calculator and a discrete time oscillator. The ADC is for receiving a TV video signal with an H-sync and converting the received signal into a digital TV video signal. The AGC and clamping circuit is for receiving the digital TV video signal, performing an AGC and clamping processing and then generating a clamped signal with a controlled amplitude. The slice level calculator is for receiving the above-mentioned clamped signal, estimating the level of the H-sync and outputting a level-indicating signal. The H-sync frequency calculator receives the clamped signal and the level-indicating signal and then estimates an H-sync frequency. The increment step number calculator receives an estimated H-sync frequency, a predetermined frequency for each line to output pixels and a required total pixel quantity output from each line (H-sync total), and outputs a regular increment step number according to the received frequencies and H-sync total. The discrete time oscillator is for receiving the regular increment step number and a dynamic increment step number and adjusting the frequency of the timing signal output from the PLL according to the received step numbers.

The present invention further provides a PLL method for an H-sync. The method includes: performing a clamping operation on a received TV video signal, following by generating a clamped signal with a controlled amplitude; then calculating the level of the H-sync according to the clamped signal, slicing the clamped signal and producing a level-indicating signal; calculating an estimated H-sync frequency according to the clamped signal and level-indicating signal; calculating a regular increment step number according to the estimated H-sync frequency, the predetermined frequency for each line to output pixels and the required H-sync total; adjusting the frequency of the output timing signal according to the regular increment step number and the dynamic increment step number.

In the PLL device and PLL method provided by the present invention, an estimated from the active TV video signal and dynamically adjustable H-sync frequency, not a predetermined H-sync frequency, is adopted, so as to enhance the tolerance of deviations of an H-sync.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention provides an H-sync PLL for a TV video signal to enhance the tolerance of deviations of an H-sync. In the PLL embodiment of the present invention, an estimated and dynamically adjustable H-sync frequency from the active TV video signal, not a predetermined H-sync frequency, is adopted, so as to enhance the tolerance of deviations of an H-sync.

Figure 1:
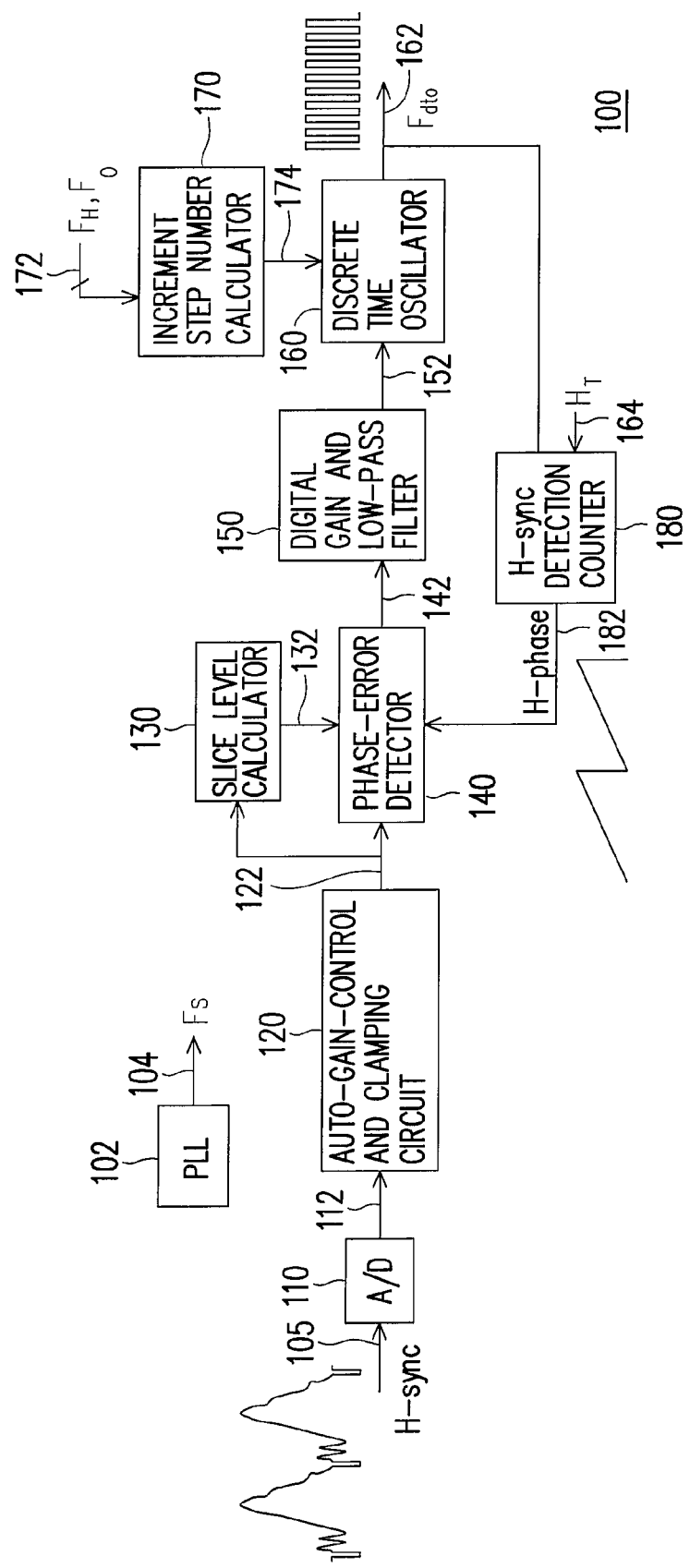
FIG. 1 is an architecture diagram of a conventional H-sync phase locked loop circuit for a TV video signal.
Figure 2:
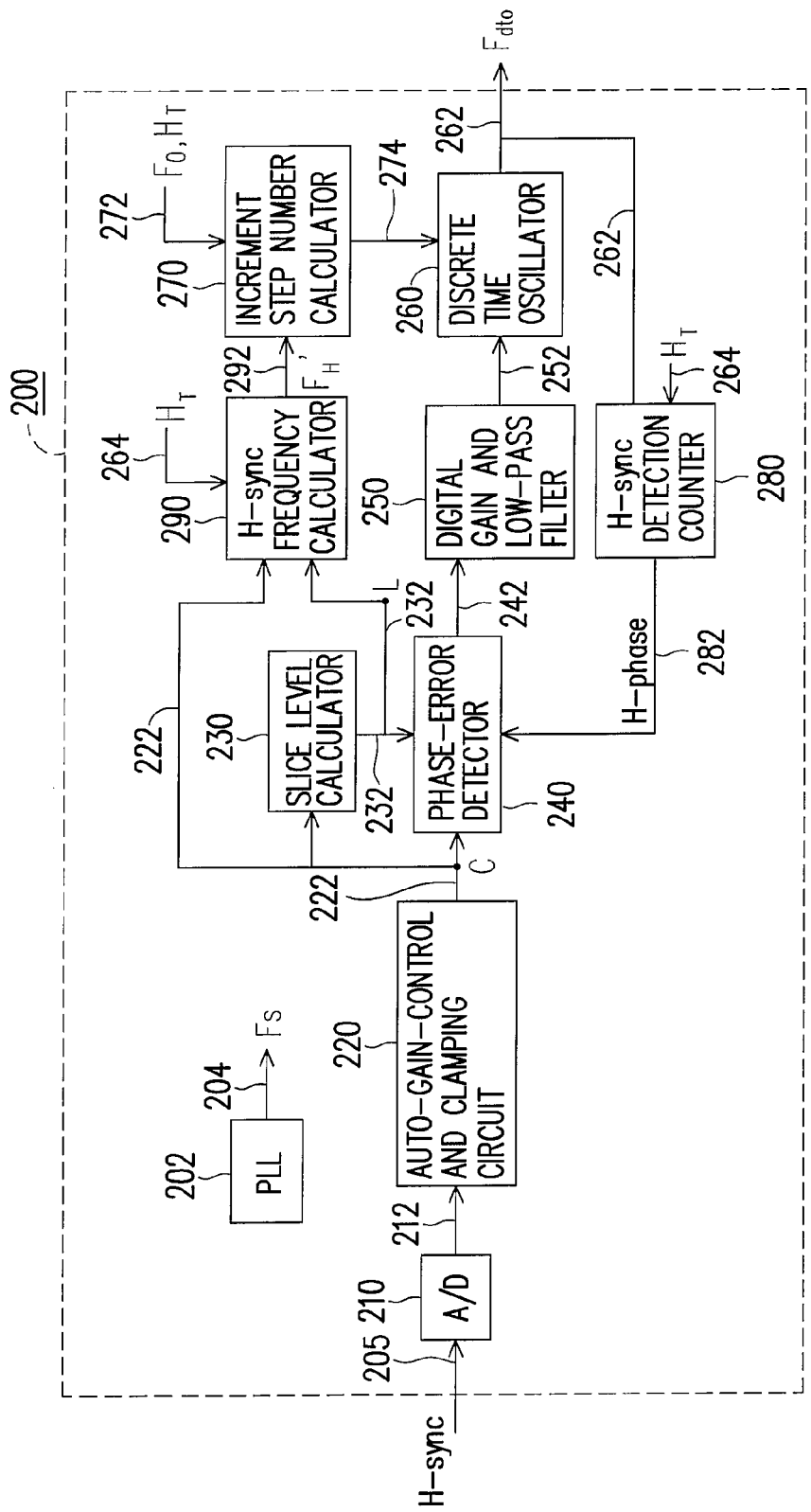
FIG. 2 is an architecture diagram of a H-sync phase locked loop circuit for a TV video signal according to a preferred embodiment of the present invention.

Referring to FIG. 2, it is an architecture diagram of an H-sync phase locked loop circuit for a TV video signal according to a preferred embodiment of the present invention. The H-sync phase locked loop device (H-sync PLL device) 200 mainly is in charge of correctly and effectively obtaining an H-sync and includes a PLL latch 202, an analog-to-digital converter (ADC) 210 (represented by 'A/D' in FIG. 2), an auto-gain-control and clamping circuit (AGC and clamping circuit) 220, a slice level calculator 230, a phase-error detector 240, a digital gain and low-pass filter 250, a discrete time oscillator 260, an increment step number calculator 270, a H-sync detection counter 280 and a H-sync frequency calculator 290.

The PLL latch 202 is for outputting a system timing signal 204 having a frequency $F_S$ to support the operation of the whole system including providing the ADC 210 with a sampling frequency. When the ADC 210 receives a TV video signal 205 containing an H-sync, the signal 205 is converted into a digital TV video signal 212. After that, the digital TV video signal 212 is sent to the AGC and clamping circuit 220 to perform an AGC and clamping processing to produce a clamped signal 222 with a controlled amplitude (marked in 'C' in FIG. 2), and then the signal 222 is output to the slice level calculator 230, the phase-error detector 240 and the H-sync frequency calculator 290.

Once the slice level calculator 230 receives the clamped signal 222, a middle level of the H-sync is estimated and the estimated middle level 232 (marked in 'L' in FIG. 2) is output to the phase-error detector 240 and the H-sync frequency calculator 290. On the other hand, the phase-error detector 240 receives the clamped signal 222, the estimated level-indicating signal 232 from the slice level calculator 230 and an H-sync phase signal (H-phase signal) 282 from the H-sync detection counter 280. The phase-error detector generates a signal falling and rising transient according to the level comparison result between the clamped signal 222 and the level-indicating signal 232, calculates the dynamic error of the H-phase signal 282 therewith and further generates a phase-error signal 242 output to the digital gain and low-pass filter 250. After the H-sync frequency calculator 290 receives the clamped signal 222 and the level-indicating signal 232, an estimated H-sync frequency $F'_H$ is given and sent to the increment step number calculator 270.

The H-phase signal 282 is output from the H-sync detection counter 280, while the H-sync detection counter 280 receives a timing signal 262 with a frequency $F_{dto}$ output from the discrete time oscillator 260 and a preset required total pixel quantity output from each line (H-sync total) $H_T$. Every period course of the timing signal 162 with the frequency $F_{dto}$, the number indicated by the H-sync detection counter 280, i.e. the H-phase signal output therefrom, would be increased by one until the H-phase signal reaches $\frac{1}{2}H_T$ where the H-phase signal is reset as $-\frac{1}{2}H_T$.

After the phase-error signal 242 is processed by the digital gain and low-pass filter 250, a dynamic increment step number 252 is output to the discrete time oscillator 260. The increment step number calculator 270 receives the estimated H-sync frequency $F'_H$, a predetermined frequency for each line to output pixels $F_O$ and an H-sync total $H_T$, and outputs a regular increment step number 274 to the discrete time oscillator 260, and then the discrete time oscillator 260 adjusts the frequency $F_{dto}$ of the timing signal 262 according to the regular increment step number 274 and the dynamic increment step number 252.

The estimated H-sync frequency $F'_H$ is obtained by using the following equation (1), while the above-mentioned regular increment step number 274 is obtained by using the following equations (3)-(5):

$$F'_H = F_S \cdot (2H'_T)^{-1} \cdot 10^3 \tag{1}$$

$$F'_O = F'_H \cdot H_T \cdot 10^{-3} \tag{2}$$

$$\Delta I = F'_O \cdot F_S^{-1} \cdot 2^{30} = H_T \cdot (2H'_T)^{-1} \cdot 2^{30} \tag{3}$$

$$I = F_O \cdot F_S^{-1} \cdot 2^{30} \tag{4}$$

$$I' = \begin{cases} I - \Delta I, & \text{if } H'_T > H_T \\ I + \Delta I, & \text{if } H'_T < H_T \\ I, & \text{if } H'_T = H_T \end{cases} \tag{5}$$

In the above listed equations, $F'_H$ represents the estimated H-sync frequency, $F_S$ represents the frequency of the system timing signal, $H'_T$ represents the required quantity by primitively-estimating for each line to output pixels, I represents the regular increment step number and $\Delta I$ represents the adjustment value of the regular increment step number. If $H'_T$ is greater than the H-sync total $H_T$, the updated regular increment step number I' is I-$\Delta I$; If $H'_T$ is less than the H-sync total $H_T$, the updated regular increment step number I' is I+$\Delta I$; If $H'_T$ is equal to the H-sync total $H_T$, the updated regular increment step number I' is I.

Figure 3:
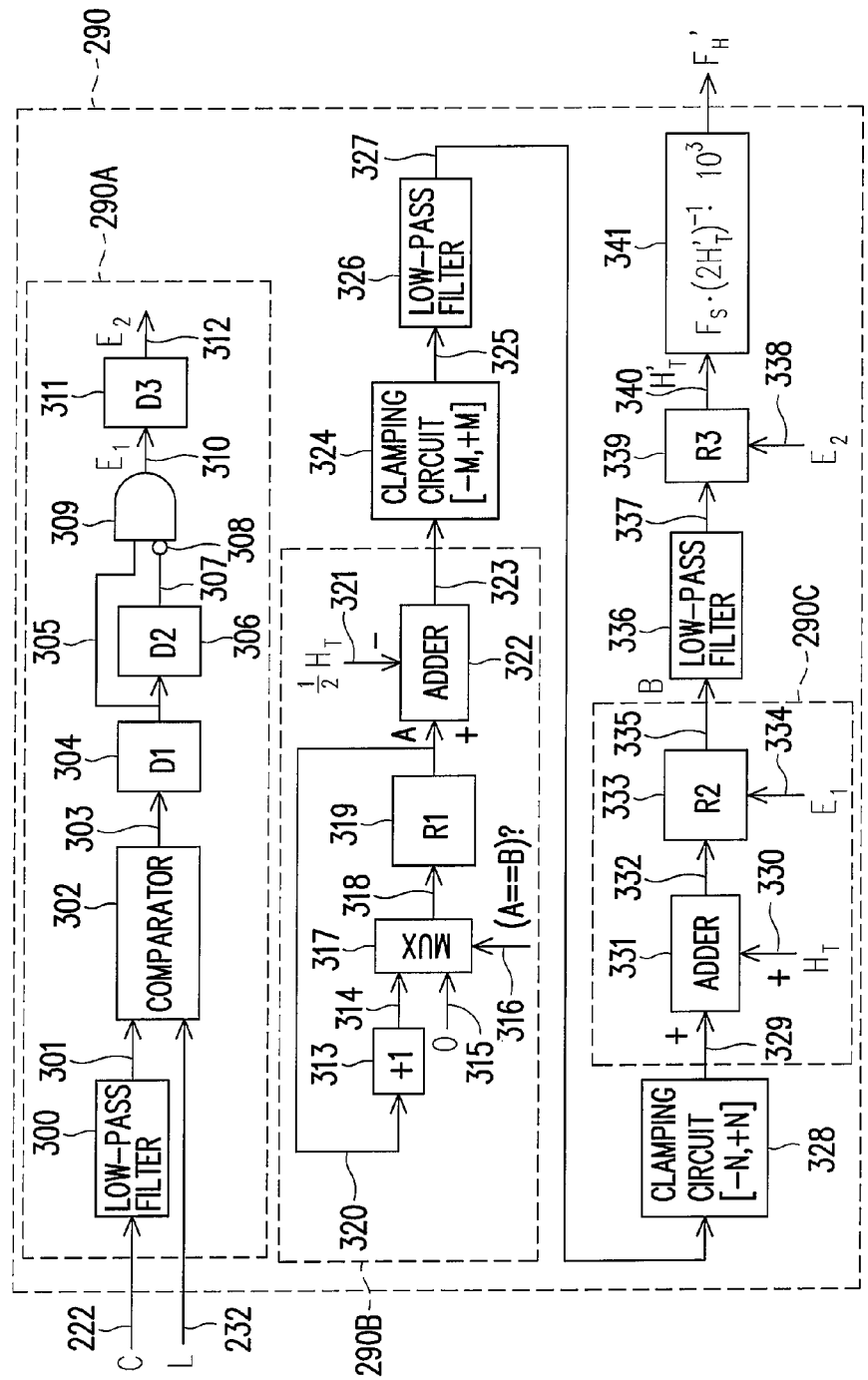
FIG. 3 is a schematic circuit drawing of the H-sync frequency calculator in the H-sync phase locked loop circuit of FIG. 2 according to an embodiment of the present invention.

Referring to FIG. 3, it is a schematic circuit drawing of the H-sync frequency calculator 290 in the H-sync phase locked loop circuit of FIG. 2 according to an embodiment of the present invention. The H-sync frequency calculator 290 includes a section of producing enabling signals for updating 290A for receiving a clamped signal 222 (marked in 'C' in FIG. 3) and a level-indicating signal 232 (marked in 'L' in FIG. 3), detecting the falling and rising transients of the H-sync and producing enabling signals for updating E1 and E2. The section 209A includes a low-pass filter 300, a comparator 302, delay units 304, 306 and 311 and an AND gate 309.

The low-pass filter 300 receives the clamped signal 222 and outputs a filtered signal 301. Then, the filtered signal 301 and the level-indicating signal 232 are compared from each other by the comparator 302, the comparison result 303 is sent to the delay units 304, the delayed signal 305 is sent to an input terminal of the AND gate 309 and another input terminal of the AND gate 309 is connected to the phase-inverted signal 307 from the delay unit 306. The output of the AND gate 309 is the enabling signal for updating E1, which is sent to the delay unit 311 to generate another enabling signal for updating E2. The above-mentioned enabling signals for updating E1 and E2 represent the falling and rising transients of the H-sync, i.e. the rising edge and the falling edge of the H-sync.

The H-sync frequency calculator 290 further includes a calculation section 290B for calculating the difference between the period of the H-sync of the input signal and the period of the standard H-sync. The section 290B includes a logic-1 pulse circuit 313, a multiplexer 317 (marked in 'MUX' in the figure), a register 319 (marked in 'R1' in the figure) and an adder 322. The output of the section 290B is sent to a clamping circuit 324, a low-pass filter 326 and a clamping circuit 328 to limit the amplitude of the obtained signal.

The output of the register 319 is marked as 'A' herein, which is updated by means of the signal 318 every two periods of the system timing signal with the frequency $F_S$, wherein the signal 318 is the output of the multiplexer 317 after selecting one of the input signals 314 and 315. The multiplexer 317 selects the signal 314 or the signal 315 according to the criterion of whether A is equal to B where B is the output of the register 333 and explained hereinafter. The output signal A has a triangle-like waveform ascending from 0 to $H_T$, wherein once the signal ascends to $H_T$, the signal would be reset to 0 which is controlled by the signal 316. The value $H_T$ is the predetermined H-sync total.

After the adder 322, the output signal A is subtracted by a half of $H_T$ value and an error value 323 is obtained. The successive clamping circuit 324 clamps the error value 323 to the range of −M and +M and a clamped error value 325 is obtained. After that, the clamped error value 325 is processed by the low-pass filter 326 and the clamping circuit 328 (the clamping circuit 328 is in charge of clamping the signal between −N and +N), an average error value 329 is obtained.

The H-sync frequency calculator 290 further includes a register-updating section 290C for calculating the period of the input H-sync and updating the register according to the enabling signal for updating E1. The register-updating section 290C includes an adder 331 and a register 333 (marked in 'R2' in the figure). The adder 331 adds a $H_T$ value to the average error value 329 to get a pre-determined H-sync total 335, i.e. the above-mentioned B value. Further, the register 333 is updated according to the enabling signal for updating E1.

Furthermore, the output signal is sent to a low-pass filter 336 and then a register 339 (marked in 'R3'), following by obtaining a signal T according to the enabling signal for updating E2. When the signal T is sent to a calculation circuit 341, an estimated H-sync frequency $F'_H$ can be given by using the above-mentioned equation (1) and $F'_H$ is output from the H-sync frequency calculator 290.

Figure 4:
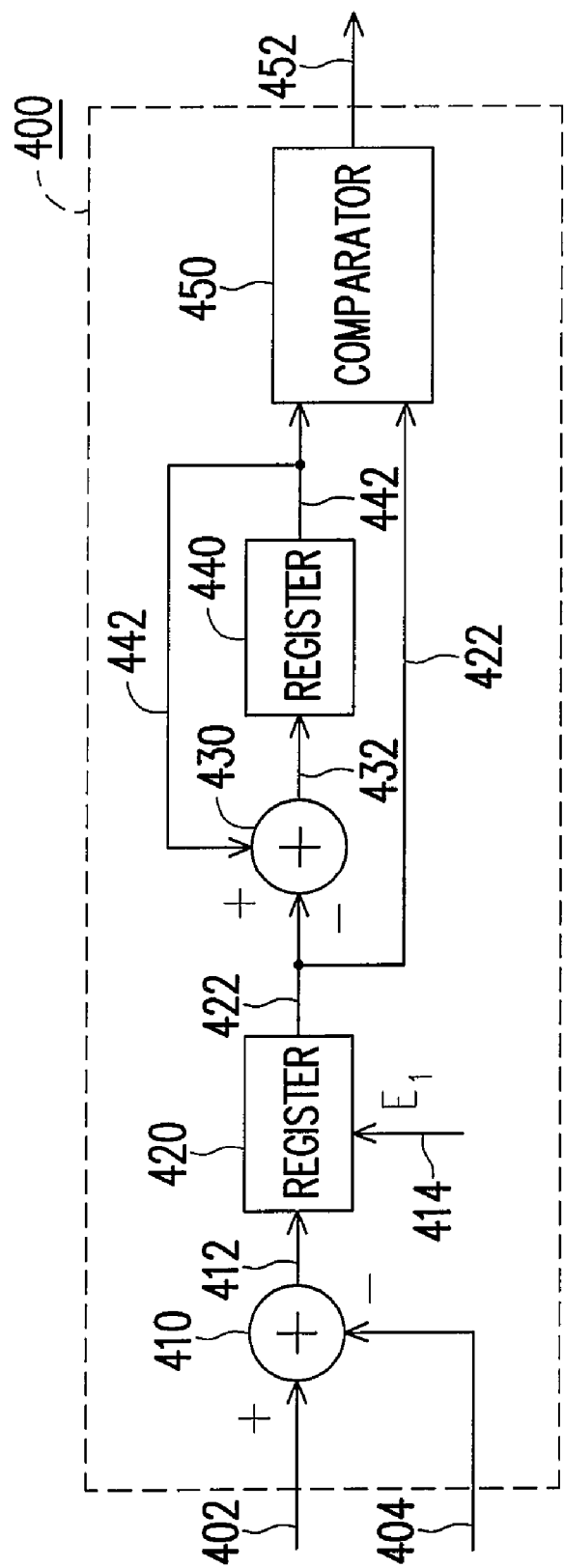
FIG. 4 is a schematic circuit drawing of the discrete time oscillator 260 in the H-sync phase locked loop circuit of FIG. 2 according to an embodiment of the present invention.

Referring to FIG. 4, it is a schematic circuit drawing of the discrete time oscillator 260 in the H-sync phase locked loop circuit of FIG. 2 according to an embodiment of the present invention. First, the discrete time oscillator 400 receives a regular increment step number 402 and a dynamic increment step number 404, both of which are the same as the regular increment step number 274 and the dynamic increment step number 252 in FIG. 2. The adder 410 subtracts the dynamic increment step number 404 from the regular increment step number 402 to get an output signal 412 sent to the register 420. Next, the register 420 is triggered by the enabling signal for updating E1 to update the output signal 412 into the output signal 422. The output signal 422 is sent to an input terminal of the comparator 450 where the output signal 422 is subtracted by a feedback signal 442 to get another signal 432 sent to a register 440.

The signal 432 received by the register 440 is delayed by a system period to get the above-mentioned feedback signal 442, which is sent to another input terminal of the comparator 450 where the feedback signal 442 is compared with the output signal 422 and a verified output signal of the discrete time oscillation signal 452 is obtained for output.

Since in the H-sync PLL device according to the embodiment of the present invention, an estimated from the active TV video signal and dynamically adjustable H-sync frequency, not a predetermined H-sync frequency, is adopted, therefore, the tolerance of deviations of an H-sync is enhanced. In the embodiment, the scheme is mainly: converting a TV video signal into a digital signal, clamping the digital signal to a given range to get a sliced level-indicating signal for detecting the falling and rising transients of the H-sync and generating enabling signals for updating. According to the signals, the H-sync frequency calculator of the embodiment is able to calculate the dynamic H-sync frequency of the input TV video signal served for replacing the predetermined H-sync frequency. In this way, the tolerance of deviations of an H-sync is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An H-sync phase locked loop device, comprising:
   an analog-to-digital converter, for receiving a TV video signal with an H-sync and converting the received signal into a digital TV video signal;
   an auto-gain-control and clamping circuit, for receiving the digital TV video signal, performing an AGC and clamping processing and then generating a clamped signal with a controlled amplitude;
   a slice level calculator, for receiving the above-mentioned clamped signal, estimating the level of the H-sync and outputting a level-indicating signal;
   an H-sync frequency calculator, comprising:
      a first circuit section, for receiving the clamped signal and the level-indicating signal, detecting the falling and rising transients of the H-sync according to the received signals and producing a first enabling signal for updating and a second enabling signal for updating;
      a second circuit section, for calculating the difference between the period of the H-sync of the input signal and the period of a standard H-sync;
      a clamping and low-pass filtering circuit, for receiving the difference output from the second circuit section and converting the difference into an average error value by means of the operation of the clamping and low-pass filtering circuit;
      a third circuit section, for receiving the average error value and the first enabling signal for updating, adding the predetermined total pixel quantity output from each line to the average error value and then updating the standard period of the input H-sync according to the first enabling signal for updating;
      a low-pass filter, for low-pass filtering the standard period of the H-sync for output;
      a register unit, for receiving the output from the low-pass filter and the second enabling signal for updating, updating the storage content according to the enabling of the second enabling signal for updating for output; and
      a calculation circuit, for receiving the storage content of the register unit, calculating the received content and obtaining an H-sync frequency;
   an increment step number calculator, for outputting an increment step number according to the H-sync frequency, a predetermined frequency for each line to output pixels, and a predetermined total pixel quantity output from each line; and
   a discrete time oscillator, for receiving the increment step number and a dynamic increment step number and for adjusting the frequency of the timing signal output from the phase locked loop circuit according to the received step numbers.

2. The H-sync phase locked loop device according to claim 1, further comprising:
   an H-sync detection counter, receiving the frequency of the timing signal output from the phase locked loop circuit and outputting a synchronization phase signal according to the predetermined total pixel quantity output from each line;
   a phase-error detector, for receiving the clamped signal, the level-indicating signal and the synchronization phase signal, calculating a dynamic error of the synchronization phase signal according to the level comparison result between the clamped signal and the level-indicating signal, wherein the dynamic error is served as a phase-error signal for output;
   a digital gain and low-pass filter, for receiving the phase-error signal, performing a gaining and low-pass filtering on the received signal and outputting the dynamic increment step, so that the discrete time oscillator is able to adjust the frequency of the timing signal output from the phase locked loop circuit.

3. An H-sync phase locked loop device, comprising:
   an analog-to-digital converter, for receiving a TV video signal with an H-sync and converting the received signal into a digital TV video signal;
   an auto-gain-control and clamping circuit, for receiving the digital TV video signal, performing an AGC and clamping processing and then generating a clamped signal with a controlled amplitude;
   a slice level calculator, for receiving the above-mentioned clamped signal, estimating the level of the H-sync and outputting a level-indicating signal;
   a phase-error detector, for receiving the clamped signal, the level-indicating signal and a synchronization phase signal, and for calculating a dynamic error of the synchronization phase signal according to the level comparison result between the clamped signal and the level-indicating signal, wherein the dynamic error is served as a phase-error signal for output;
   a digital gain and low-pass filter, for receiving the phase-error signal, performing a gaining and low-pass filtering on the received signal and outputting a dynamic increment step;
   an H-sync frequency calculator, comprising:
      a first circuit section, for receiving the clamped signal and the level-indicating signal, detecting the falling and rising transients of the H-sync according to the received signals and producing a first enabling signal for updating and a second enabling signal for updating;
      a second circuit section, for calculating the difference between the period of the H-sync of the input signal and the period of a standard H-sync;
      a clamping and low-pass filtering circuit, for receiving the difference output from the second circuit section and converting the difference into an average error value by means of the operation of the clamping and low-pass filtering circuit;
      a third circuit section, for receiving the average error value and the first enabling signal for updating, adding the predetermined total pixel quantity output from each line to the average error value and then updating the standard period of the input H-sync according to the first enabling signal for updating;
      a low-pass filter, for low-pass filtering the standard period of the H-sync for output;
      a register unit for receiving the output from the low-pass filter and the second enabling signal for updating, updating the storage content according to the enabling of the second enabling signal for updating for output; and a calculation circuit, for receiving the storage content of the register unit, calculating the received content and obtaining an H-sync frequency;

an increment step number calculator, for outputting a regular increment step number according to the H-sync frequency, a predetermined frequency for each line to output pixels and a predetermined total pixel quantity output from each line;

a discrete time oscillator, for receiving the regular increment step number and the dynamic increment step number and adjusting the frequency of the timing signal output from the phase locked loop circuit according to the received step numbers; and an H-sync detection counter, for receiving the frequency of the timing signal output from the phase locked loop circuit and outputting the synchronization phase signal according to the predetermined total pixel quantity output from each line.

4. An H-sync phase locked loop method, comprising:

performing a clamping operation on a digital TV video signal and generating a clamped signal with a controlled amplitude;

calculating a level of the H-sync according to the clamped signal and slicing the clamped signal to generating a level-indicating signal;

detecting the falling and rising transients of the H-sync according to the clamped signal and the level-indicating signal and producing a first enabling signal for updating and a second enabling signal for updating;

calculating the difference between the period of the H-sync of the input signal and a period of a standard H-sync;

performing an operation of clamping and low-pass filtering on the difference and converting the difference into an average error value;

adding the predetermined total pixel quantity output from each line to the average error value and then updating the period of the standard H-sync according to the first enabling signal for updating;

performing a low-pass filtering on the period of the standard H-sync for output and updating the storage content according to the enabling of the second enabling signal for updating for output; and calculating the storage content and obtaining an H-sync frequency according to the storage content;

calculating a regular increment step number according to the H-sync frequency, a predetermined frequency for each line to output pixels and a predetermined total pixel quantity output from each line; and adjusting the frequency of the output timing signal according to the regular increment step number and a dynamic increment step number.

5. The H-sync phase locked loop method according to claim 4, further comprising:

generating a synchronization phase signal according to the frequency of the output timing signal and the predetermined total pixel quantity output from each line;

calculating a dynamic error of the synchronization phase signal according to the comparison result between the clamped signal and the level-indicating signal and outputting the calculation result in term of a phase error signal;

performing a gaining and low-pass filtering operation on the phase error signal, outputting the dynamic increment step number and adjusting the frequency of the output timing signal therewith.

* * * * *